United States Patent
Teng

(10) Patent No.: US 6,548,222 B2
(45) Date of Patent: *Apr. 15, 2003

(54) ON-PRESS DEVELOPABLE THERMOSENSITIVE LITHOGRAPHIC PRINTING PLATES

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

This patent is subject to a terminal disclaimer.

(21) Appl. No.: 10/023,342

(22) Filed: Dec. 17, 2001

(65) Prior Publication Data

US 2002/0068240 A1 Jun. 6, 2002

Related U.S. Application Data

(63) Continuation-in-part of application No. 09/656,052, filed on Sep. 6, 2000, and a continuation-in-part of application No. 09/873,598, filed on Jun. 4, 2001, now Pat. No. 6,482,571, and a continuation-in-part of application No. 09/952,933, filed on Sep. 14, 2001.

(51) Int. Cl.$^7$ .............. G03F 7/09; G03F 7/11; G03F 7/15
(52) U.S. Cl. ............. 430/278.1; 430/271.1; 430/944; 430/180.1; 430/288.1
(58) Field of Search ............. 430/278.1, 271.1

(56) References Cited

U.S. PATENT DOCUMENTS

| | | | | |
|---|---|---|---|---|
| 4,273,851 A | * | 6/1981 | Muzyczko et al. | 43/175 |
| 5,208,135 A | * | 5/1993 | Patel et al. | 430/281.1 |
| 5,258,263 A | | 11/1993 | Cheema et al. | 430/309 |
| 5,379,698 A | | 1/1995 | Nowak et al. | 101/454 |
| 5,491,046 A | | 2/1996 | DeBoer et al. | 430/302 |
| 5,516,620 A | | 5/1996 | Cheng et al. | 430/138 |
| 5,616,449 A | | 4/1997 | Cheng et al. | 430/302 |
| 5,674,658 A | | 10/1997 | Burbery et al. | 430/262 |
| 5,677,106 A | | 10/1997 | Burbery et al. | 430/253 |
| 5,677,110 A | | 10/1997 | Chia et al. | 430/302 |
| 5,705,309 A | | 1/1998 | West et al. | 430/167 |
| 5,807,659 A | * | 9/1998 | Nishimiya et al. | 430/302 |
| 5,910,395 A | * | 6/1999 | Li et al. | 430/302 |
| 5,955,238 A | | 9/1999 | Yokoya et al. | 430/166 |
| 6,014,929 A | | 1/2000 | Teng | 101/456 |
| 6,071,675 A | | 6/2000 | Teng | 430/302 |
| 6,117,610 A | | 9/2000 | Sheriff et al. | 430/190 |
| 6,153,356 A | | 11/2000 | Urano et al. | 430/281.1 |
| 6,232,038 B1 | | 5/2001 | Takasaki et al. | 430/281.1 |
| 6,242,156 B1 | | 6/2001 | Teng | 430/271.1 |

FOREIGN PATENT DOCUMENTS

JP 2000-131867-a * 5/2000

* cited by examiner

Primary Examiner—Cynthia Hamilton

(57) ABSTRACT

On-press ink and/or fountain solution developable lithographic printing plates having on a roughened substrate a substantially conformal thermosensitive layer capable of hardening upon exposure to an infrared radiation; The surface of the thermosensitive layer has peaks and valleys substantially corresponding to the major peaks and valleys of the substrate microscopic surface, allowing low tackiness and good block resistance. The plate can be imagewise exposed with an infrared radiation and then on-press developed with ink and/or fountain solution by rotating the plate cylinder and engaging ink and/or fountain solution roller. The developed plate can ten directly print images to the receiving sheets. The imagewise exposure can be performed off press or with the plate being mounted on the plate cylinder of a lithographic press.

54 Claims, No Drawings

ON-PRESS DEVELOPABLE THERMOSENSITIVE LITHOGRAPHIC PRINTING PLATES

RELATED PATENT APPLICATIONS

This application is a continuation-in-part of my U.S. patent application Ser. Nos. 09/656,052 filed Sep. 6, 2000, 09/873,598 filed Jun. 4, 2001, now U.S. Pat. No. 6,482,571 and Ser. No. 09/952,933 filed Sep. 14, 2001.

FIELD OF THE INVENTION

This invention relates to lithographic printing plates. More particularly, it relates to on-press ink and/or fountain solution developable lithographic plates having on a substrate a thermosensitive layer capable of hardening upon exposure to an infrared laser radiation.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

Lithographic printing can be further divided into two general types: wet lithographic printing (conventional lithographic printing) and waterless lithographic printing. In wet lithographic printing plates, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic (ink-repelling). In waterless lithographic printing plates, the ink-receptive areas consist of oleophilic materials and the ink-repelling areas consist of oleophobic materials; no dampening with fountain solution is required.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. Here, hardening means becoming insoluble in a certain developer. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened areas.

On-press developable lithographic printing plates have been disclosed in the literature. Such plates can be directly mounted on press after exposure to develop with ink and/or fountain solution during the initial press operation and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,242,156.

Conventionally, the plate is exposed with an actinic light (usually an ultraviolet light from a lamp) through a separate photomask film having predetermined image pattern that is placed between the light source and the plate. While capable of providing plate with superior lithographic quality, such a method is cumbersome and labor intensive.

Laser sources have been increasingly used to imagewise expose a printing plate that is sensitized to a corresponding laser wavelength. This allows the elimination of the photomask film, reducing material, equipment and labor cost.

Among the laser imagable plates, infrared laser sensitive plates are the most attractive because they can be handled and processed under white light. Infrared laser sensitive plates are also called thermosensitive plates or thermal plates because the infrared laser is usually converted to heat to cause a certain chemical or physical change (such as hardening, solubilization, ablation, phase change, or thermal flow) needed for plate making (although in some systems certain electron or energy transfers from the infrared dye to the initiator may also take place).

Various thermosensitive plates have been disclosed in the patent literature. Examples of thermosensitive plates are described in U.S. Pat. Nos. 4,054,094 and 5,379,698 (laser ablation plates), 5,705,309, 5,674,658, 5,677,106, 6,153,356, 6,232,038, and 4,997,745 (negative thermosensitive plates), 5,491,046 and 6,117,610 (both positive and negative thermosensitive plates, depending on the process), and 5,919,600 and 5,955,238 (thermosensitive positive waterless plate).

Despite the progress in conventional on-press developable plates and digital laser imagable plates, there is a desire for a lithographic plate which can be imaged by infrared laser, does not produce ablation debris, and does not require a separate liquid development process. More specifically, there is a desire for a thermosensitive lithographic plate that is on-press developable with ink and/or fountain solution.

SUMMARY OF THE INVENTION

It is an object of this invention to provide a thermosensitive lithographic plate which is imagable with an infrared radiation (including infrared laser) and on-press developable with ink and/or fountain solution.

It is another object of this invention to provide an on-press developable thermosensitive lithographic plate having on a substrate a thermosensitive layer comprising a polymerizable monomer, an initiator, and an infrared absorbing dye or pigment.

It is yet another object of this invention to provide a method of on-press development or on-press imaging and development of the above lithographic plate.

Further objects, features and advantages of the present invention will become apparent from the detailed description of the preferred embodiments.

According to the present invention, there has been provided a negative lithographic printing plate capable of on-press development with ink and/or fountain solution, comprising on a substrate a thermosensitive layer, said thermosensitive layer being capable of hardening upon exposure to an infrared radiation and on-press developable with ink and/or fountain solution; wherein at least the hardened areas of said thermosensitive layer exhibit an affinity or aversion substantially opposite to the affinity or aversion of said substrate to at least one printing liquid selected from the group consisting of ink and an abhesive fluid for ink. The on-press developable lithographic plate is improved by coating the thermosensitive layer conformally on a roughened substrate so that the surface of the thermosensitive layer has peaks and valleys substantially corresponding to the major peaks and valleys of the substrate microscopic surface.

This invention also describes on-press development, and on-press imaging and development of the above lithographic plates.

The plate can be imagewise exposed with an infrared radiation on a plate exposure device and then transferred to a lithographic press for on-press development with ink and/or fountain solution by rotating the plate cylinder and engaging ink and/or fountain solution roller. The developed plate can then directly print images to the receiving sheets. Alternatively, the plate can be imagewise exposed with an infrared radiation while mounted on a plate cylinder of a lithographic press, on-press developed on the same press cylinder with ink and/or fountain solution, and then directly print images to the receiving sheets. Infrared laser is a preferred infrared radiation.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support that has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the thermosensitive layer; commonly, a wet lithographic plate has a hydrophilic substrate and an oleophilic thermosensitive layer. For waterless plate, the substrate should have an oleophilic or oleophobic surface, depending on the surface properties of the thermosensitive layer.

Particularly preferred hydrophilic substrate for a wet lithographic plate is an aluminum support that has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For preparing printing plates of the current invention, any thermosensitive layer is suitable which is capable of hardening through polymerization or crosslinking upon exposure to an infrared radiation (about 700 to 1500 nm in wavelength), and is soluble or dispersible in and on-press developable with ink (for waterless plate) or ink and/or fountain solution (for wet plate). Here hardening means becoming insoluble and non-dispersible in ink and/or fountain solution, and is achieved through polymerization or crosslinking of to resins (monomers, oligomers, or polymers). An infrared absorbing dye or pigment is usually used in the thermosensitive layer as sensitizer or light-to-heat converter. The thermosensitive layer preferably has a coverage of from 100 to 4000 mg/m$^2$, and more preferably from 400 to 2000 mg/m$^2$.

It is noted that the thermosensitive layer can be a single layer with substantially homogeneous composition along the depth. However, the thermosensitive layer can consist of more than one sublayers having different compositions (such as different resins) or different material ratios in each layer (such as higher infrared dye amount in the inner layer than the top layer). The thermosensitive layer may also have composition gradient along the depth (such as lower infrared dye amount toward the surface and higher infrared dye amount toward the substrate).

Thermosensitive layer suitable for the current invention may be formulated from various thermosensitive materials containing an infrared absorbing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water-soluble polymer or small molecule, and ink soluble polymer or small molecule. The addition of nonionic surfactant is especially helpful in making the thermosensitive layer dispersible with ink and fountain solution, or emulsion of ink and fountain solution. Various additives useful for conventional thermosensitive layer can also be used. These additives include pigment, dye, exposure indicator, and stabilizer.

Thermosensitive materials useful in negative-working wet plates of this invention include, for example, thermosensitive compositions comprising a polymerizable monomer, thermosensitive initiator, and infrared light absorbing dye or pigment.

It is noted that, in this patent, the term monomer includes both monomer and oligomer, and the term (meth)acrylate includes both acrylate and methacrylate.

In a preferred embodiment as for negative-working wet lithographic printing plates of this invention, the thermosensitive layer comprises at least one epoxy or vinyl ether monomer having at least one epoxy or vinyl ether functional group, at least one Bronsted acid generator capable of generating free acid in the presence of an infrared absorbing dye or pigment upon exposure to an infrared radiation, and at least one infrared absorbing dye or pigment, optionally with one or more polymeric binders. Other additives such as surfactant, dye or pigment, exposure-indicating dye (such as leuco crystal violet, azobenzene, 4-phenylazodiphenylamine, and methylene blue dyes), and acid quencher (usually an alkaline compound, such as tetrabutylammonium hydroxide or triethylamine) may be added.

In a second preferred embodiment as for negative-working wet lithographic printing plates of this invention, the thermosensitive layer comprises at least one polymerizable ethylenically unsaturated monomer having at least one terminal ethylenic group, at least one free-radical initiator capable of generating free radical in the presence of an infrared absorbing dye or pigment upon exposure to an infrared radiation, and at least one infrared absorbing dye or pigment, optionally with one or more polymeric binders. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. It is noted that certain additives can significantly reduce the polymerization rate of a free radical polymerization system sensitized by an infrared absorbing dye and should be avoided or used at minimum.

In a third preferred embodiment as for negative-working wet lithographic printing plates of this invention, the thermosensitive layer contains both free radical and cationic polymerization systems. The thermosensitive layer can comprise an ethylenically unsaturated monomer, a free-radical initiator, an epoxy or vinyl ether monomer, a Bronsted acid generator, and an infrared absorbing dye or pigment, optionally with one or more polymeric binders. Various other additives may be added. The ethylenically unsaturated monomer and the epoxy or vinyl ether functional monomer can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radical and free acid in the presence of an infrared dye or pigment upon exposure to an infrared radiation.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Any free radical initiator capable of generating free radical in the presence of an infrared absorbing dye or pigment upon exposure to an infrared radiation can be used as the thermosensitive free radical initiator of this invention. Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethylenoxy)-phen-1-yl]-s-triazine, and s-triazines as described in U.S. Pat. Nos. 5,955,238, 6,037,098, 6,010,824, and 5,629,354); and titanocene (bis($\eta^9$-2,4-cyclopentadien-1-yl) bis[2,6-difluoro-3-(1H-pyrrol-1-yl)phenyl) titanium). Onium salts, borate salts, and s-triazines are preferred thermosensitive free radical initiators. Diaryliodonium salts and triarylsulfonium salts are preferred onium salts. Triarylalkylborate salts are preferred borate salts. Trichloromethyl substituted s-triazines are preferred s-triazines.

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because the infrared absorbing dye usually has higher absorbing efficiency, gives less visible color, and allows molecular level charge or energy transfer to activate the initiator. The infrared dye or pigment is added in the thermosensitive layer preferably at 0.01 to 30% by weight of the thermosensitive layer, more preferably at 0.1 to 20%, and most preferably at 0.5 to 10%.

While a thermosensitive layer generally comprises an infrared absorbing dye or pigment, the infrared dye moiety may also be incorporated into the molecules of the initiator, monomer, oligomer, or polymer. For example, infrared dye moieties are incorporated into the polymer of a thermosensitive layer for a waterless lithographic plate as described in U.S. Pat. No. 6,132,933. Clearly, this polymer can function as both polymeric binder and infrared absorbing dye.

Suitable polymeric binders for the thermosensitive layers of this invention include, for example, polystyrene, (meth) acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and polyurethane binder. Also useful are aqueous alkaline soluble polymers, such as (meth)acrylic polymer with substantial number of carboxylic acid functional groups, polymer with substantial number of phenol groups, and polymer with (meth)acrylate groups and carboxylate salt groups as described in U.S. Pat. No. 5,849,462. For oleophilic thermosensitive layers, preferred polymeric binders are aqueous alkaline-insoluble oleophilic polymers. The polymers may or may not have polymerizable functional groups (such as ethylenic group, epoxy group, or vinyl ether group).

Various surfactants may be added into the thermosensitive layer to allow or enhance the on-press ink and/or fountain solution developability. Both polymeric and small molecule surfactants can be used. However, it is preferred that the surfactant has low or no volatility so that it will not evaporate from the thermosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g thermosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the thermosensitive layer, more preferably from 0.5 to 20%, and most preferably from 1 to 15%.

A particulate dispersion may be added into the thermosensitive layer to enhance, for example, the developability and non-tackiness of the plate, as described in U.S. Pat. No. 6,071,675, the entire disclosure of which is hereby incorporated by reference.

When a photoinitiator is used as the free acid or free radical initiator in the thermosensitive layer, the photoinitiator can be sensitive to ultraviolet light (or even visible light), or can be only sensitive to light of shorter wavelength, such as lower than 350 nm. Thermosensitive layer containing ultraviolet light (or visible light) sensitive photoinitiator will also allow actinic exposure with ultraviolet light (or visible light). Thermosensitive layer containing photoinitiator only sensitive to shorter wavelength (such as shorter than 350 nm) will have good white light stability. Each type of initiators has its own advantage, and can be used to design a specific product. In this patent, all types of photoinitiators can be used.

The hardened areas of the thermosensitive layer should exhibit an affinity or aversion substantially opposite to the affinity or aversion of the substrate to at least one printing liquid selected from the group consisting of ink and an abhesive fluid for ink. An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

The thermosensitive layer useful for the plate of this invention usually has substantially the same affinity or aversion before and after exposure. However, an on-press developable thermosensitive layer that changes affinity or aversion dramatically upon exposure so that it has affinity or aversion similar to the substrate before exposure and opposite to the substrate after exposure can also be used for the lithographic plate of this invention. For example, a plate can have a hydrophilic substrate and an ink and/or fountain solution soluble or dispersible hydrophilic thermosensitive layer that is capable of hardening and becoming oleophilic upon exposure to an infrared laser. While such a thermosensitive layer is more complicated in composition, it has the advantage that the non-hardened areas do not need to be completely developed off very quickly during the initial printing process. The non-hardened areas can act as the hydrophilic areas of the plate for initial lithographic printing and gradually be developed off to reveal the hydrophilic substrate that will act as the permanent hydrophilic areas of the plate. The change in affinity or aversion of the thermosensitive layer upon infrared laser irradiation can be achieved by, for example, loss of a hydrophilic functional group such as decomposition of salt functional groups, or crosslinking of resins with salt functional groups so that the penetration of water to the thermosensitive layer is minimized.

A preferred thermosensitive layer of such a plate comprises a polymer having thermally decomposable salt functional groups, a free radical polymerizable ethylenically unsaturated monomer, a free-radical initiator, and an infrared absorbing dye. A second preferred thermosensitive layer of such a plate comprises a free radical polymerizable ethylenically unsaturated monomer having thermally decomposable salt functional groups, a free-radical initiator, and an infrared absorbing dye. Here the thermosensitive layer is hydrophilic, soluble or dispersible in ink and/or fountain solution, and capable of hardening and becoming oleophilic upon exposure to an infrared radiation. Regular monomer, oligomer, or polymer that does not have salt functional groups, and various additives such as pigment, dye, exposure indicator, and surfactant can be added into the thermosensitive layer. Suitable salt functional groups are described in U.S. Pat. Nos. 6,190,830, 6,190,831, and 6,159,657, and can be used for the salt functional groups containing polymer, monomer or oligomer of this invention. Examples of suitable salt functional groups include organoonium groups (such as organoammonium, organophosphonium, and organosulfonium groups), N-alkylated aromatic heterocyclic groups, carboxylate salt groups (such as tetraalkylammonium carboxylate groups), sulfonate salt groups (such as sulfonic acid triethylamine salt).

The thermosensitive layer may be conformally coated onto a roughened substrate (for example, with Ra of larger than 0.4 micrometers) at thin coverage (for example, of less than 1.5 g/m$^2$) so that the plate can have microscopic peaks and valleys on the thermosensitive layer coated surface and exhibit low tackiness and good block resistance, as described in U.S. Pat. No. 6,242,156, the entire disclosure of which is hereby incorporated by reference. Here the substrate has a roughened surface comprising peaks and valleys, and the thermosensitive layer is substantially conformally coated on the roughened substrate surface so that the surface of the thermosensitive layer has peaks and valleys substantially corresponding to the major peaks and valleys of the substrate microscopic surface. In a preferred embodiment, the substrate has an average surface roughness Ra of about 0.2 to about 2.0 microns, the thermosensitive layer has an average coverage of about 0.1 to about 2.0 g/m$^2$, and the average height of the valleys on the thermosensitive layer surface is at least 0.1 microns below the average height of the peaks on the thermosensitive layer surface. Such a configuration is especially useful for a plate with a semisolid thermosensitive layer because it allows reduction or elimination of the tackiness and fingerprinting problems.

An ink and/or fountain solution soluble or dispersible overcoat may be deposited on top of the thermosensitive layer to, for example, protect the thermosensitive layer from oxygen inhibition, contamination, and/or physical damage during handling, reduce tackiness and blocking tendency, and/or improve the on-press developability. For wet plate, the overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Various nonionic surfactants and ionic surfactants can be used. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.01 to 40% by weight of the overcoat, more preferably at 0.2 to 15%. The overcoat preferably has a coverage of from 0.001 to 1 g/m$^2$, more preferably from 0.002 to 0.45 g/m$^2$, most preferably from 0.005 to 0.20 g/m$^2$.

For plates with rough and/or porous surface capable of mechanical interlocking with a coating deposited thereon, a thin releasable interlayer soluble or dispersible in ink (for waterless plate) or ink and/or fountain solution (for wet plate) may be deposited between the substrate and the thermosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference.

The plate is usually coated on a manufacture line by coating the thermosensitive layer, and optionally the overcoat and/or the interlayer, on the substrate. The coated plate (which is usually cut to suitable sizes) is sold as commercial products to be used in the pressroom for imaging and printing. For direct-to-press applications, alternatively, the plate may be directly coated on the plate cylinder of a lithographic press equipped with digital laser imaging device. The thermosensitive layer can be coated onto the substrate which is a sheet material mounted on the plate cylinder or is the surface of the plate cylinder of the press. A coating device containing the thermosensitive fluid can be mounted on the press. The coating device can coat through any means, such as slot coating, roller coating, spray coating, and inkjet. The coating fluid can be a solvent or aqueous solution or dispersion, or can be free of solvent or water. For coating free of solvent or water, a liquid or semisolid thermosensitive coating material can be used. After coating (and optionally further drying), the thermosensitive layer can be exposed with an infrared laser to imagewise harden the exposed areas. The exposed plate surface can then be contacted with ink and/or fountain solution to remove the non-hardened areas and to print imaging from the plate (usually through a blanket cylinder) to the receiving medium. The plate substrate can be a sheet material mounted on the plate cylinder, or can be the cylinder surface. Press with the cylinder surface as the substrate can be used for seamless printing. For press using the cylinder surface as the substrate or with a reusable plate substrate, after the completion of printing, the hardened thermosensitive layer may be stripped off by various means, including wiping with a cloth dampened with a solvent or solution or stripping with a blade. Such a stripping process may be performed by hand or with a stripping device mounted on the press. The stripped substrate can be re-coated with the thermosensitive layer (and optionally the overcoat and/or interlayer) to form a thermosensitive plate for next imaging and printing application.

For press using the cylinder surface as the substrate or with a reusable plate substrate, the thermosensitive layer (and optionally overcoat and/or interlayer) coating, digital exposure with infrared radiation, on-press development with ink and/or fountain solution, printing to the receiving sheet, and stripping can be performed sequentially and continuously around the rotating plate cylinder so that each printed sheet can have different imaging. For such an application, the thermosensitive layer must be able to develop quickly upon contact with the ink and/or fountain solution rollers. Such a process is suitable for variable data printing. When miniaturized, such a system can be used for desktop printing, performing similar function as the current laser Xerox printer and inkjet printer.

The lithographic plate of the present invention can also be used as a seamless sleeve printing plate. In this option the printing plate is soldered in a cylindrical form. This cylindrical printing plate which has a diameter of the plate cylinder diameter is slid onto the plate cylinder from one end of the plate cylinder. The seamless sleeve printing plate can be coated with thermosensitive layer (and optionally the overcoat and/or interlayer) before or after sliding onto the plate cylinder of the press.

The infrared radiation suitable for exposing the lithographic plate of the instant invention can be from any infrared radiation source suitable for digital imaging. Infrared lasers are preferred infrared radiation sources. Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 mJ/cm$^2$, more preferably from 5 to 1000 mJ/cm$^2$, most preferably from 30 to 500 mJ/cm$^2$, depending on the sensitivity of the thermosensitive layer.

Laser imaging devices are currently widely available commercially. Any device can be used which provides imagewise laser exposure according to digital imaging information. Commonly used imaging devices include flatbed imager, internal drum imager, and external drum imager. Internal drum imager and external drum imager are preferred imaging devices.

The plate can be imaged off press or on press. For off-press imaging, the plate is imagewise exposed with a laser in a plate imaging device, and the exposed plate is then mounted on the plate cylinder of a lithographic press to be developed with ink (for waterless plate) or with ink and/or fountain solution (for wet plate) by rotating the press cylinders and contacting the plate with ink and/or fountain solution and to lithographically print images from said plate to the receiving media (such as papers). For on-press imaging, the plate is exposed while mounted on a lithographic printing press cylinder, and the exposed plate is directly developed on press with ink and/or fountain solution during initial press operation and then prints out regular printed sheets. This is especially suitable for computer-to-press application in which the plate (or plates, for multiple color press) is directly exposed on the plate cylinder of a press according to computer generated digital imaging information and, with minimum or no treatment, directly prints out regular printed sheets. For on-press development, good quality prints should be obtained preferably under 20 initial impressions, and more preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink by Flink Ink Company, which can be used for printing wet lithographic plate without the use of fountain solution, can also be used for the on-press development and printing of the plate of this invention.

The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution.

A liquid layer may be applied onto the surface of the plate (with or without an overcoat) before and/or during imaging process to provide an in situ oxygen barrier layer during the imaging process to allow faster photospeed and better curing. The liquid layer can be any liquid material that does not cause substantial adverse effect on the plate. Water, fountain solution, and other aqueous solutions are preferred materials for forming the liquid layer for a plate with an oleophilic thermosensitive layer. The liquid layer may be applied from a dampening roller of a lithographic press with the plate being mounted on the plate cylinder during on-press imaging process. The dampening roller can be a regular dampening roller which supplies fountain solution during printing or can be a different roller.

An inert gas (such as nitrogen) may be introduced within the device or near the exposure areas during a laser imaging process to reduce oxygen inhibition of free radical polymerization of the thermosensitive layer. The inert gas may be flushed from a nozzle mounted next to the laser head onto the areas being imaged during the laser imaging process; this is especially useful for external drum imaging devices, including off-press laser imaging devices having an external drum and on-press laser imaging devices utilizing plate cylinder as the imaging drum.

This invention is further illustrated by the following non-limiting examples of its practice. Unless specified, all the values are by weight.

EXAMPLE 1

An electrochemically roughened, anodized, and polyvinyl phosphonic acid treated aluminum sheet was coated using a #6 Meyer rod with a thermosensitive layer formulation TS-1, followed by drying in an oven at 70° C. for 5 min.

| TS-1 | |
|---|---|
| Component | Weight ratios |
| Epon 1031 (Epoxy resin from Shell Chemical Company) | 2.114 |
| Cyracure UVR-6110 (Epoxy resin from Union Carbide) | 3.442 |
| Cyracure UVI-6990 (Cationic initiator from Union Carbide) | 1.387 |
| Microlith Black C-K (Carbon black dispersed in polymer binder, from Ciba-Geigy) | 3.750 |
| Ethyl acetate | 78.590 |
| Acetone | 10.717 |

The above plate was exposed with an infrared laser plate imager equipped with laser diodes (8-channels, about 500 mW each) emitting at 830 nm with a laser size of about 15 microns (ThermalSetter™, from Optronics). The plate was placed on the imaging drum and secured with vacuum (and masking tape if necessary). The exposure dosage was controlled by the drum speed. The plate was exposed at a laser dosage (about 300–500 mJ/cm$^2$) which is sufficient to cause hardening in the exposed areas but not high enough to cause thermal ablation. Visible image pattern (in different tone of black) was seen in the exposed areas.

The exposed plate was subjected to hand test for on-press developability. The plate was rubbed back and forth for 10 times with a cloth soaked with both fountain solution and ink to check on-press developability and inking. The plate developed completely under 8 double rubs. The non-exposed areas of the thermosensitive layer were completely removed, and the exposed areas of the thermosensitive layer stayed on the substrate. The developed plate showed well-inked imaging pattern in the exposed areas and clean background in the non-exposed areas.

EXAMPLE 2

An electrochemically roughened, anodized, and polyvinyl phosphonic acid treated aluminum sheet was coated using a #6 Meyer rod with a thermosensitive layer formulation TS-2, followed by drying in an oven at 70° C. for 5 min.

| TS-2 | |
|---|---|
| Component | Weight ratios |
| Epon 1031 (Epoxy resin from Shell Chemical Company) | 2.326 |
| Cyracure UVR-6110 (Epoxy resin from Union Carbide) | 3.786 |
| Cyracure UVI-6974 (Sulfonium salt cationic initiator from Union Carbide) | 0.852 |
| CD-1012 (Iodonium salt cationic initiator from Sartomer Company) | 0.252 |
| Neocryl B-728 (Polymeric binder from Zeneca) | 2.520 |
| IR-140 (Infrared dye from Eastman Kodak) | 0.654 |
| FC120 (Surfactant from 3M) | 0.036 |
| Ethyl acetate | 78.825 |
| Acetone | 10.749 |

The plate was exposed and hand developed as in EXAMPLE 1. The exposed plate showed dark-blue color in the exposed areas. The plate developed completely under 8 double rubs, with the non-imaging areas of the thermal sensitive layer being completely removed. The developed plate showed well-inked imaging pattern, and clean background.

EXAMPLE 3

An electrochemically grained, anodized, and silicate treated aluminum substrate (with an Ra of about 0.5 microns) was coated using a #6 Meyer rod with a thermosensitive layer formulation TS-3, followed by drying in an oven at 80° C. for 5 min.

| TS-3 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 0.50 |
| PINA FK-1026 (Infrared absorbing polymethine dye from Allied Signal) | 0.20 |
| Acetone | 90.2 |

The above plate was exposed with an infrared laser plate imager equipped with laser diodes emitting at about 830 nm (Pearlsetter™, from Presstek). The plate was mounted on the imaging drum (external drum) and exposed at a laser dosage of about 600 mJ/cm$^2$.

The plate was tested on a wet lithographic press (AB Dick 360) equipped with integrated inking/dampening system. The exposed plate was directly mounted on the plate cylinder of the press. The press was started for 10 rotations, and the ink roller (carrying emulsion of ink and fountain solution) was then applied to the plate cylinder to rotate until the plate showed clean background. The plate cylinder was then engaged with the blanket cylinder and printed with papers. The printed sheets showed good inking in exposed areas and clean background in non-exposed areas under 10 impressions. The press continued to run for a total of 100 impressions without showing any wearing (The press stopped at 100 impressions.).

EXAMPLE 4

The plate prepared in EXAMPLE 3 was further coated with a water-soluble overcoat OC-1 using a #6 Meyer rod, followed by drying in an oven at 80° C. for 5 min.

| OC-1 | |
|---|---|
| Component | Weight ratios |
| Airvol 205 (Polyvinyl alcohol from Air Products) | 2.00 |
| Zonyl FSO (Perfluorinated surfactant from DuPont) | 0.02 |
| Water | 98.00 |

The overcoated plate was exposed and on-press developed as in EXAMPLE 3. The printed sheets showed good inking in exposed areas and clean background in non-exposed areas under 5 impressions. The plate continued to run for a total of 100 impressions without showing any wearing (The press stopped at 100 sheets.).

EXAMPLE 5

In this example, the plate is the same as in EXAMPLE 3 except that a thin releasable interlayer (a water-soluble polymer) is interposed between the substrate and the thermosensitive layer.

An electrochemically roughened, anodized, and silicate treated aluminum sheet was first coated with a 0.2% aqueous solution of polyvinyl alcohol (Airvol 540, from Air Products) with a #6 Meyer rod, followed by drying in an oven at 80° C. for 5 min. The polyvinyl alcohol coated substrate was further coated with the thermosensitive layer formulation TS-3 with a #6 Meyer rod, followed by drying in an oven at 80° C. for 5 min.

The plate was exposed and on-press developed as in EXAMPLE 3. The printed sheets showed good inking in exposed areas and clean background in non-exposed areas under 2 impressions. The plate continued to run for a total of 100 impressions without showing any wearing (The press stopped at 100 sheets.).

EXAMPLE 6

An electrochemically roughened, anodized, and silicate treated aluminum sheet was first coated with a 0.1% aqueous solution of polyvinyl alcohol (Airvol 540, from Air Products) with a #6 Meyer rod, followed by drying in an oven at 80° C. for 5 min. The polyvinyl alcohol coated substrate was further coated with the thermosensitive layer formulation TS-4 with a #6 Meyer rod, followed by drying in an oven at 80° C. for 5 min.

| TS-4 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| Cyracure 6974 (Mixed triarylsulfonium hexafluoroantimonate from Union Carbide) | 1.00 |
| PINA FK-1026 (Infrared absorbing polymethine dye from Allied Signal) | 0.20 |
| Acetone | 90.2 |

The thermosensitive layer coated plate was further coated with a water-soluble overcoat OC-2 using a #6 Meyer rod, followed by drying in an oven at 80° C. for 5 min.

| OC-2 | |
|---|---|
| Component | Weight ratios |
| Airvol 205 (Polyvinyl alcohol from Air Products) | 0.2 |
| Dioctyl sulfosuccinate sodium salt (surfactant) | 0.01 |
| Water | 99.8 |

The plate was exposed with an infrared laser plate imager equipped with laser diodes emitting at about 830 nm (Dimension 400, from Presstek). The plate was mounted on the imaging drum and exposed at a laser dosage of about 450 mJ/cm$^2$.

The exposed plate was on-press developed as in EXAMPLE 3. The printed sheets showed good inking in exposed areas and clean background in non-exposed areas under 2 impressions. The plate continued to run for a total of 200 impressions without showing any wearing (The press stopped at 200 sheets.).

EXAMPLE 7

This example illustrates imagewise exposure with an infrared radiation from a conventional light source.

The same plate as in EXAMPLE 6 was exposed with an infrared lamp (from General Electric) under a negative photomask made of aluminum foil for 4 minutes. The infrared light source was positioned at 4 inches away from the photomask-covered plate during the exposure.

The exposed plate was on-press developed as in EXAMPLE 3. The printed sheets showed good inking in exposed areas and clean background in non-exposed areas under 2 impressions. The plate continued to run for a total of 200 impressions without showing any wearing (The press stopped at 200 sheets.).

EXAMPLE 8

An electrochemically roughened, anodized, and silicate treated aluminum sheet was first coated with a 0.1% aqueous solution of polyvinyl alcohol (Airvol 540, from Air Products) with a #6 Meyer rod, followed by drying in an oven at 80° C. for 5 min. The polyvinyl alcohol coated substrate was further coated with the thermosensitive layer formulation TS-5 with a #6 Meyer rod, followed by drying in an oven at 80° C. for 5 min.

| TS-5 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 0.70 |
| 2,4-Bis(trichloromethyl)-6-[(4-ethoxyethylenoxy)-phen-1-yl]-s-triazine | 0.30 |
| ADS-830AT (Infrared absorbing cyanine dye from American Dye Source) | 0.10 |
| Acetone | 90.2 |

The thermosensitive layer coated plate was further coated with a water-soluble overcoat OC-3 using a #6 Meyer rod, followed by drying in an oven at 80° C. for 5 min.

| OC-3 | |
|---|---|
| Component | Weight ratios |
| Airvol 205 (Polyvinyl alcohol from Air Products) | 2.00 |
| Dioctyl sulfosuccinate sodium salt (surfactant) | 0.08 |
| Water | 98.0 |

The plate was exposed with an infrared laser plate imager equipped with laser diodes emitting at about 830 nm (Dimension 400, from Presstek). The plate was mounted on the imaging drum and exposed at a laser dosage of about 300 mJ/cm$^2$. The exposed areas showed yellow-brown imaging pattern, in contrast to the light green non-imaged areas.

The exposed plate was on-press developed as in EXAMPLE 3. The printed sheets showed good inking in exposed areas and clean background in non-exposed areas under 2 impressions. The plate continued to run for a total of 200 impressions without showing any wearing (The press stopped at 200 sheets.).

EXAMPLE 9

An electrochemically roughened, anodized, and silicate treated aluminum sheet was first coated with a 0.1% aqueous solution of polyvinyl alcohol (Airvol 540, from Air Products) with a #6 Meyer rod, followed by drying in an oven at 80° C. for 5 min. The polyvinyl alcohol coated substrate was further coated with the thermosensitive layer formulation TS-6 with a #6 Meyer rod, followed by drying in an oven at 80° C. for 5 min.

| TS-6 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| ADS-830AT (Infrared absorbing cyanine dye from American Dye Source) | 0.02 |
| Acetone | 90.2 |

The thermosensitive layer coated plate was further coated with a water-soluble overcoat OC-3 using a #6 Meyer rod, followed by drying in an oven at 80° C. for 5 min.

The plate was exposed with an infrared laser plate imager equipped with laser diodes emitting at about 830 nm (Dimension 400, from Presstek). The plate was mounted on the imaging drum and exposed at a laser dosage of about 300 mJ/cm$^2$.

The exposed plate was on-press developed as in EXAMPLE 3. The printed sheets showed good inking in the exposed areas and clean background in the non-exposed areas under 2 impressions. The plate continued to run for a total of 200 impressions without showing any wearing (The press stopped at 200 sheets.).

EXAMPLE 10

An electrochemically roughened, anodized, and silicate treated aluminum sheet was first coated with a 0.1% aqueous solution of polyvinyl alcohol (Airvol 540, from Air Products) with a #6 Meyer rod, followed by drying in an oven at 80° C. for 5 min. The polyvinyl alcohol coated substrate was further coated with the thermosensitive layer formulation TS-7 with a #6 Meyer rod, followed by drying in an oven at 80° C. for 5 min.

| TS-7 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #6 Meyer rod, followed by drying in an oven at 80° C. for 5 min.

The plate was exposed with an infrared laser plate imager equipped with laser diodes emitting at about 830 nm (Trendetter from CreoScitex). The plate was mounted on the imaging drum and exposed at a laser dosage of about 300 mJ/cm$^2$. The exposed areas showed glossier but essentially colorless imaging pattern, in contrast to the less glossy non-imaged areas.

The exposed plate was on-press developed as in EXAMPLE 3. The printed sheets showed good inking in exposed areas and clean background in non-exposed areas under 2 impressions. The plate continued to run for a total of 200 impressions without showing any wearing (The press stopped at 200 sheets.).

EXAMPLE 11

An electrochemically grained, anodized, and silicate treated aluminum substrate was coated using a #6 Meyer rod with a thermosensitive layer formulation TS-8, followed by drying in an oven at 80° C. for 5 min.

TS-8

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| PINA FK-1151 (Infrared absorbing polymethine dye from Allied Signal) | 0.30 |
| Acetone | 90.2 |

Five sheets of the above thermosensitive layer coated plates were prepared. The plates were further coated with a water-soluble overcoat from a solution consisting of Airvol 205 (polyvinyl alcohol from Air Products) in water with addition of Zonyl FSO (Perfluorinated surfactant from DuPont) at about 0.02% by weight of the solution using a #6 Meyer rod, followed by drying in an oven at 80° C. for 5 min. The solution concentration and coating coverage are listed in Table 1.

The above plates were each exposed with an infrared laser plate imager equipped with laser diodes emitting at about 830 nm (Trendetter from CreoScitex). The plate was mounted on the imaging drum and exposed at a laser dosage of about 400 mJ/cm$^2$.

The plates were tested on a wet lithographic press (AB Dick 360) equipped with integrated inking/dampening system. The exposed plate was directly mounted on the plate cylinder of the press. The press was started for 10 rotations, and the ink roller (carrying emulsion of ink and fountain solution) was then applied to the plate cylinder to rotate for 10 rotations. The plate cylinder was then engaged with the blanket cylinder and printed to papers. The press continued to run for a total of 200 impressions. The press test results are listed in Table 1.

TABLE 1

| Overcoat polymer | Overcoat coverage (g/m$^2$) | Roll-up to clean background (Rotations) | Roll-up to good inking (Rotations) | Wearing at 200 impressions |
|---|---|---|---|---|
| No overcoat | None | 40 | 1 | No |
| Airvol 205 | 0.02 | 10 | 1 | No |
| Airvol 205 | 0.20 | 10 | 1 | No |
| Airvol 205 | 0.40 | 10 | 20 | No |
| Airvol 205 | 1.00 | 10 | 80 | No |

I claim:

1. A negative lithographic printing plate comprising on a substrate a thermosensitive layer; said thermosensitive layer being soluble or dispersible in and on-press developable with ink and/or fountain solution, and capable of hardening through polymerization or crosslinking upon exposure to an infrared radiation; and at least the hardened areas of said thermosensitive layer exhibiting an affinity or aversion substantially opposite to the affinity or aversion of said substrate to at least one printing liquid selected from the group consisting of ink and an abhesive fluid for ink; wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of from 0.2 to 2.0 microns, said thermosensitive layer has an average coverage of from 0.1 to 2.0 g/m$^2$, and the avenge height of the valleys on the thermosensitive layer surface is at least 0.1 microns below the average height of the peaks on the thermosensitive layer surface.

2. The lithographic plate of claim 1 wherein the average height of the valleys on the thermosensitive layer surface is at least 0.1 microns below the average height of the major peaks on the substrate surface.

3. The lithographic plate of claim 1 wherein the average height of the valleys on the thermosensitive layer surface is at least 0.3 microns below the average height of the peaks on the thermosensitive layer surface.

4. The lithographic plate of claim 1 wherein the average height of the valleys on the thermosensitive layer surface is at least 0.5 microns below the average height of the peaks on the thermosensitive layer surface.

5. The lithographic plate of claim 1 wherein said substrate has an average surface roughness Ra of from 0.3 to 1.0 microns, and said thermosensitive layer has an average coverage of from 0.2 to 1.4 g/m$^2$.

6. The lithographic plate of claim 1 wherein said substrate has an average surface roughness Ra of from 0.4 to 0.8 microns, and said thermosensitive layer has an average coverage of from 0.4 to 1.1 g/m$^2$.

7. The lithographic plate of claim 1 wherein said substrate is hydrophilic; and said thermosensitive layer is oleophilic and comprises an epoxy or vinyl ether monomer having at least one epoxy or vinyl ether group, a cationic initiator, and an infrared absorbing dye or pigment.

8. The lithographic plate of claim 1 wherein said substrate is hydrophilic; and said thermosensitive layer is oleophilic and comprises a free radical polymerizable ethylenically unsaturated monomer having at least one terminal ethylenic group, a free-radical initiator, and an infrared absorbing dye or pigment.

9. The lithographic plate of claim 1 wherein said substrate is hydrophilic; and said thermosensitive layer is oleophilic and comprises an oleophilic polymeric binder, a (meth) acrylate monomer, a free-radical initiator, and an infrared absorbing dye.

10. The lithographic plate of claim 1 further including a releasable interlayer interposed between the substrate and the thermosensitive layer, said releasable interlayer being soluble or dispersible in ink and/or fountain solution; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

11. The lithographic plate of claim 1 further including an ink and/or fountain solution soluble or dispersible overcoat on the thermosensitive layer.

12. The lithographic plate of claim 11 wherein said overcoat has a coverage of 0.001 to 1 g/m².

13. The lithographic plate of claim 11 wherein said overcoat has a coverage of 0.002 to 0.45 g/m².

14. The lithographic plate of claim 11 wherein said overcoat has a coverage of 0.005 to 0.20 g/m².

15. The lithographic plate of claim 1 wherein said thermosensitive layer exhibits an affinity or aversion substantially opposite to the affinity or aversion of said substrate before and after exposure to an infrared radiation.

16. The lithographic plate of claim 15 wherein said substrate is hydrophilic and said thermosensitive layer is oleophilic.

17. The lithographic plate of claim 15 wherein said substrate is oleophilic and said thermosensitive layer is oleophobic.

18. The lithographic plate of claim 15 wherein said substrate is oleophobic and said thermosensitive layer is oleophilic.

19. The lithographic plate of claim 1 wherein said thermosensitive layer has substantially the same affinity or aversion as the substrate before exposure to an infrared radiation, and is capable of switching to substantially opposite affinity or aversion after exposure to an infrared radiation.

20. The lithographic plate of claim 19 wherein said substrate is hydrophilic; and said thermosensitive layer is hydrophilic before exposure to an infrared radiation and is capable of becoming oleophilic after exposure to an infrared radiation.

21. The lithographic plate of claim 1 wherein said thermosensitive layer comprises an epoxy or vinyl ether monomer having at least one epoxy or vinyl ether group, a cationic initiator, and an infrared absorbing dye.

22. The lithographic plate of claim 21 wherein said thermosensitive layer further comprises a free radical polymerizable ethylenically unsaturated monomer having at least one terminal ethylenic group, and a free radical initiator; and is capable of both cationic and free radical polymerizations upon exposure to an infrared radiation.

23. The lithographic plate of claim 21 wherein said cationic initiator is capable of generating both free acid and free radical, and said thermosensitive layer further comprises a free radical polymerizable ethylenically unsaturated monomer having at least one terminal ethylenic group and is capable of both cationic and free radical polymerizations upon exposure to an infrared radiation.

24. The lithographic plate of claim 21 wherein said epoxy or vinyl ether monomer has both epoxy or vinyl ether group and free radical polymerizable ethylenic group, said cationic initiator is capable of generating both free acid and free radical, and said thermosensitive layer is capable of both cationic and free radical polymerizations upon exposure to an infrared radiation.

25. The lithographic plate of claim 1 wherein said substrate is a metal sheet.

26. The lithographic plate of claim 1 wherein said substrate is an aluminum sheet.

27. The lithographic plate of claim 1 wherein said substrate is a polymeric film.

28. The lithographic plate of claim 1 wherein said substrate is the external surface of a sleeve and said plate is a seamless sleeve printing plate.

29. The lithographic plate of claim 1 wherein said substrate is the external surface of a elate cylinder of a lithographic press.

30. A negative lithographic printing plate comprising on a hydrophilic substrate an oleophilic thermosensitive layer; said thermosensitive layer being soluble or dispersible in and on-press developable with ink and/or fountain solution, and capable of hardening through free radical or cationic polymerization upon exposure to an infrared radiation; wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of from 0.2 to 2.0 microns, said thermosensitive layer has an average coverage of from 0.1 to 2.0 g/m², and the average height of the valleys on the thermosensitive layer surface is at least 0.1 microns below the average height of the peaks on the thermosensitive layer surface.

31. The lithographic plate of claim 30 wherein the average height of the valleys on the thermosensitive layer surface is at least 0.1 microns below the average height of the major peaks on the substrate surface.

32. The lithographic plate of claim 30 wherein the average height of the valleys on the thermosensitive layer surface is at least 0.3 microns below the average height of the peaks on the thermosensitive layer surface.

33. The lithographic plate of claim 30 wherein the average height of the valleys on the thermosensitive layer surface is at least 0.5 microns below the average height of the peaks on the thermosensitive layer surface.

34. The lithographic plate of claim 30 wherein said substrate has an average surface roughness Ra of from 0.3 to 1.0 microns, and said thermosensitive layer has an average coverage of from 0.2 to 1.4 g/m².

35. The lithographic plate of claim 30 wherein said substrate has an average surface roughness Ra of from 0.4 to 0.8 microns, and said thermosensitive layer has an average coverage of from 0.4 to 1.1 g/m².

36. The lithographic plate of claim 30 wherein said thermosensitive layer comprises an epoxy or vinyl ether monomer having at least one epoxy or vinyl ether group, a cationic initiator, and an infrared absorbing dye.

37. The lithographic plate of claim 30 wherein said thermosensitive layer comprises a free radical polymerizable ethylenically unsaturated monomer having at least one terminal ethylenic group, a free-radical initiator, and an infrared absorbing dye.

38. The lithographic plate of claim 37 wherein said thermosensitive layer further comprises a polymeric binder.

39. The lithographic plate of claim 37 wherein said thermosensitive layer further comprises a nonionic surfactant at 0.5 to 30% by weight of the thermosensitive layer.

40. The lithographic plate of claim 30 further including a water-soluble interlayer interposed between the substrate and the thermosensitive layer; wherein the substrate comprises a rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

41. The lithographic plate of claim 40 wherein said interlayer has an average coverage of from 0.001 to 0.100 g/m² and said substrate has an average surface roughness Ra of from 0.3 to 1.0 microns.

42. The lithographic plate of claim 40 wherein said interlayer comprises a water-soluble polymer.

43. The lithographic plate of claim 30 further including a water soluble or dispersible overcoat on the thermosensitive layer.

44. The lithographic plate of claim 43 wherein said overcoat comprises a water-soluble polymer.

45. The lithographic plate of claim 43 wherein said overcoat comprises polyvinyl alcohol.

46. The lithographic plate of claim 43 wherein said overcoat has a coverage of 0.001 to 1 g/m$^2$.

47. The lithographic plate of claim 43 wherein said overcoat has a coverage of 0.002 to 0.45 g/m$^2$.

48. The lithographic plate of claim 30 wherein said substrate is a metal sheet.

49. The lithographic plate of claim 30 wherein said substrate is an aluminum sheet with roughened surface.

50. The lithographic plate of claim 30 wherein said substrate is a grained and anodized aluminum sheet.

51. The lithographic plate of claim 30 wherein said substrate is a grained, anodized, and hydrophilically treated aluminum sheet.

52. The lithographic plate of claim 30 wherein said substrate is a hydrophilically treated polymeric film with roughened surface.

53. The lithographic plate of claim 30 wherein said substrate is the external surface of a sleeve and said plate is a seamless sleeve printing plate.

54. The lithographic plate of claim 30 wherein said substrate is the external surface of a plate cylinder of a lithographic press.

* * * * *